US009118273B2

(12) United States Patent
Martin et al.

(10) Patent No.: US 9,118,273 B2
(45) Date of Patent: Aug. 25, 2015

(54) RESILIENT MOUNTING ASSEMBLY FOR PHOTOVOLTAIC MODULES

(75) Inventors: Anthony Charles Martin, Santa Rosa, CA (US); Martin Fornage, Petaluma, CA (US); Ho Gene Choi, Pataluma, CA (US)

(73) Assignee: Enphase Energy, Inc., Petaluma, CA (US)

( * ) Notice: Subject to any disclaimer, the term of this patent is extended or adjusted under 35 U.S.C. 154(b) by 385 days.

(21) Appl. No.: 13/551,003

(22) Filed: Jul. 17, 2012

(65) Prior Publication Data

US 2013/0021730 A1    Jan. 24, 2013

Related U.S. Application Data

(60) Provisional application No. 61/508,891, filed on Jul. 18, 2011.

(51) Int. Cl.
  *H05K 7/00*    (2006.01)
  *H02S 40/32*    (2014.01)
  *H01L 31/04*    (2014.01)

(52) U.S. Cl.
  CPC ............. *H02S 40/32* (2014.12); *H02S 10/00* (2013.01); *H01L 2924/0002* (2013.01); *Y02E 10/50* (2013.01)

(58) Field of Classification Search
  USPC ............ 361/728–729, 807, 809, 810; 174/50, 174/51, 260, 373, 535, 72 B, 547; 136/244, 136/251, 293; 439/76.1, 272, 357, 358, 439/492, 535, 638
  See application file for complete search history.

(56) References Cited

U.S. PATENT DOCUMENTS

| 4,217,633 A | 8/1980 | Evans, Jr. |
| 4,283,106 A | 8/1981 | Bunnell |
| 4,310,211 A | 1/1982 | Bunnell et al. |
| 4,460,232 A | 7/1984 | Sotolongo |
| 5,280,133 A | 1/1994 | Nath |
| 5,330,362 A | 7/1994 | Ito et al. |
| 5,886,890 A | 3/1999 | Ishida et al. |
| 5,951,785 A | 9/1999 | Uchihashi et al. |
| 6,046,400 A | 4/2000 | Drummer |
| 6,066,797 A | 5/2000 | Toyomura et al. |
| 6,111,189 A | 8/2000 | Garvison et al. |
| 6,201,180 B1 | 3/2001 | Meyer et al. |
| 6,285,572 B1 | 9/2001 | Onizuka et al. |

(Continued)

FOREIGN PATENT DOCUMENTS

| DE | 198 59 732 A1 | 6/2000 |
| DE | 102004053942 A1 | 5/2006 |

(Continued)

OTHER PUBLICATIONS

Pending U.S. Appl. No. 61/270,809, "Method and System for Locating Stolen Solar Power System Components" filed Jul. 14, 2009, pp. 1-28.

(Continued)

*Primary Examiner* — Hung S Bui
(74) *Attorney, Agent, or Firm* — Moser Taboada

(57) ABSTRACT

An apparatus for mounting a power module. In one embodiment, the apparatus comprises a plurality of mounting points that (i) are flexibly connected to one another and (ii) flexibly mount the power module proximate a photovoltaic (PV) module.

20 Claims, 7 Drawing Sheets

(56) References Cited

U.S. PATENT DOCUMENTS

| | | |
|---|---|---|
| 6,291,764 B1 | 9/2001 | Ishida et al. |
| 6,311,137 B1 | 10/2001 | Kurokami et al. |
| 6,344,612 B1 | 2/2002 | Kuwahara et al. |
| 6,384,580 B1 | 5/2002 | Ochoa et al. |
| 6,465,724 B1 | 10/2002 | Garvison et al. |
| 6,465,993 B1 | 10/2002 | Clarkin et al. |
| 6,582,249 B1 | 6/2003 | Boeck et al. |
| 6,593,521 B2 | 7/2003 | Kobayashi |
| 6,605,881 B2 | 8/2003 | Takehara et al. |
| 6,713,890 B2 | 3/2004 | Kondo et al. |
| 6,750,391 B2 | 6/2004 | Bower et al. |
| 6,791,024 B2 | 9/2004 | Toyomura |
| 6,838,611 B2 | 1/2005 | Kondo et al. |
| 6,897,370 B2 | 5/2005 | Kondo et al. |
| 7,291,036 B1 | 11/2007 | Daily et al. |
| 7,297,866 B2 | 11/2007 | Aschenbrenner |
| 7,342,171 B2 | 3/2008 | Khouri et al. |
| 7,387,537 B1 | 6/2008 | Daily et al. |
| 7,406,800 B2 | 8/2008 | Cinnamon et al. |
| 7,530,830 B1 | 5/2009 | Lenox |
| 7,625,238 B2 | 12/2009 | Duesterhoeft |
| 7,850,476 B2 | 12/2010 | Good |
| 7,862,383 B2 | 1/2011 | Cours et al. |
| 7,880,098 B2 | 2/2011 | Grimberg et al. |
| 8,113,853 B2 | 2/2012 | Coyle et al. |
| 8,257,106 B2 * | 9/2012 | Fornage et al. ............... 439/357 |
| 8,635,818 B2 * | 1/2014 | Wildes ........................ 52/173.3 |
| 8,844,215 B2 * | 9/2014 | Wildes et al. ............... 52/173.3 |
| 2002/0115329 A1 | 8/2002 | Collin et al. |
| 2003/0111103 A1 | 6/2003 | Bower et al. |
| 2003/0193322 A1 | 10/2003 | Higashikozono et al. |
| 2004/0024494 A1 | 2/2004 | Bayoumi et al. |
| 2004/0177987 A1 | 9/2004 | Yoshikawa et al. |
| 2004/0261835 A1 | 12/2004 | Utsunomiya et al. |
| 2005/0022859 A1 | 2/2005 | Nass et al. |
| 2005/0054219 A1 | 3/2005 | Werner et al. |
| 2005/0054244 A1 | 3/2005 | Werner et al. |
| 2005/0116671 A1 | 6/2005 | Minami et al. |
| 2005/0161080 A1 | 7/2005 | Nieleck et al. |
| 2005/0172995 A1 | 8/2005 | Rohrig et al. |
| 2005/0268958 A1 | 12/2005 | Aoyama |
| 2006/0000504 A1 | 1/2006 | Feldmeier et al. |
| 2006/0146504 A1 | 7/2006 | Belson et al. |
| 2006/0180196 A1 | 8/2006 | Lares et al. |
| 2006/0243318 A1 | 11/2006 | Feldmeier et al. |
| 2006/0283628 A1 | 12/2006 | Feldmeier et al. |
| 2006/0289053 A1 | 12/2006 | Nieleck et al. |
| 2007/0252716 A1 | 11/2007 | Burger |
| 2007/0295392 A1 | 12/2007 | Cinnamon |
| 2007/0295393 A1 | 12/2007 | Cinnamon |
| 2008/0011348 A1 | 1/2008 | Aoyama et al. |
| 2008/0115822 A1 | 5/2008 | Cunningham et al. |
| 2008/0115911 A1 | 5/2008 | Duesterhoeft |
| 2008/0236886 A1 | 10/2008 | Gerull et al. |
| 2008/0277161 A1 | 11/2008 | Gherardini et al. |
| 2008/0283118 A1 | 11/2008 | Rotzoll et al. |
| 2008/0305668 A1 | 12/2008 | Wu |
| 2009/0084570 A1 | 4/2009 | Gherardini et al. |
| 2010/0102773 A1 | 4/2010 | Lipcsei |
| 2010/0131108 A1 | 5/2010 | Meyer |
| 2011/0083733 A1 | 4/2011 | Marroquin et al. |

FOREIGN PATENT DOCUMENTS

| | | | |
|---|---|---|---|
| EP | 0 793 278 A2 | 9/1997 | |
| EP | 0793278 A2 | 9/1997 | |
| EP | 0 855 750 A1 | 7/1998 | |
| EP | 1 672 702 A1 | 6/2006 | |
| EP | 1 998 378 A1 | 12/2008 | |
| JP | 09-135571 | 5/1997 | |
| JP | 2002-058152 | 2/2002 | |
| JP | 2004193463 A | 7/2004 | |
| JP | 2004-274088 | 9/2004 | |
| JP | 2004-289181 | 10/2004 | |
| JP | 2008-177078 | 7/2008 | |
| WO | WO 00/30216 | 5/2000 | |
| WO | WO 03/056680 A2 | 7/2003 | |
| WO | WO 03/098703 A2 | 11/2003 | |
| WO | WO 2004/006342 A1 | 1/2004 | |
| WO | WO 2005/117136 A2 | 12/2005 | |
| WO | WO 2007/140736 A1 | 12/2007 | |
| WO | WO 2008/095670 A1 | 8/2008 | |
| WO | WO 2008/108909 A1 | 9/2008 | |
| WO | WO 2008/144554 A2 | 11/2008 | |
| WO | WO 2005/117245 A1 | 12/2008 | |
| WO | WO 2009/088977 A1 | 7/2009 | |
| WO | WO 2010/091445 A1 | 8/2010 | |
| WO | WO 2011/031248 A2 | 3/2011 | |

OTHER PUBLICATIONS

Pending U.S. Appl. No. 12/284,915, "Universal Interface for a Photovoltaic Module" filed Sep. 26, 2008, pp. 1-13.
Digi-Key Corporation, Tyco Electronics, "Solar Energy & SOLARLOK", pp. 1-18, downloaded Jun. 2, 2010 from website http://dkc1.digikey.com/us/en/tod/TycoElectronicsAMP/Solarlok/Solarlok.swf.
International Search Report and Written Opinion mailed Oct. 2, 2008 for PCT Application No. PCT/US2008/063937.
International Search Report and Written Opinion mailed Dec. 23, 2008 for PCT Application No. PCT/US2008/063965.
International Search Report and Written Opinion mailed Jan. 19, 2009 for PCT Application No. PCT/US2008/063958.
International Search Report and Written Opinion mailed Nov. 26, 2009 for PCT Application No. PCT/US2008/063965.
International Search Report and Written Opinion mailed Nov. 26, 2009 for PCT Application No. PCT/US2008/063937.
H. Oldenkamp et al., AC modules: past, present and future, Workshop Installing the solar solution, Jan. 22-23, 1998, Hatfield, UK.
C. Rodriguez et al., Long-Lifetime Power Inverter for Photovoltaic AC Modules, IEEE Transactions on Industrial Electronics, vol. 55, No. 7, Jul. 2008.
S. J. Strong et al., Development of Standardized, Low-Cost AC PV Systems, NREL/SR-520-23002, Jun. 1997.
S. J. Strong et al., Development of Standardized, Low-Cost AC PV Systems, NREL/SR-520-26084, Feb. 1999.
J. Hoffner et al., A PV Window Awning System on the University of Texas Houston Heal Science Center Using AC-Modules, 0-7803-5772-8-00, 2000.
M.C. Russell et al., Sunsine300 AC Module, Annual Report Jul. 25, 1995-Dec. 31, 1996, NREL/SR-520-23432, UC Category 1280.
G. Kern, Sunsine300: Manufacture of an AC Photovoltaic Module, Final Report, Phases I & II Jul. 25, 1995-Jun. 30, 1998, NREL/SR-520-26085.
W. Bower et al., Innovative PV Micro-Inverter Topology Eliminates Electrolytic Capacitors for Longer Lifetime, 1-4244-0016-3/06, 2006.
Examination Report for Canada Patent Application No. 2698046 dated Jun. 13, 2012; 2 pages.
International Search Report and Written Opinion mailed Nov. 1, 2012 for PCT Application No. PCT/US2012/047044.
European Office Action Substantive Search Report, Application No. 12815064.6-1504 / 2735021 PCT/US2012047044, 5 Pages, Feb. 9, 2015.

* cited by examiner

RESILIENT MOUNTING ASSEMBLY FOR PHOTOVOLTAIC MODULES

CROSS-REFERENCE TO RELATED APPLICATIONS

This application claims benefit of U.S. provisional patent application Ser. No. 61/508,891, filed Jul. 18, 2011, which is herein incorporated in its entirety by reference.

BACKGROUND OF THE INVENTION

1. Field of the Invention

Embodiments of the present disclosure relate generally to mounting a power module to a photovoltaic module, and, in particular, to flexibly mounting a power module to a photovoltaic module.

2. Description of the Related Art

Solar panels, or photovoltaic (PV) modules, convert energy from sunlight received into direct current (DC). In some solar power systems, the PV modules may be coupled to power modules, such as DC-DC converters or DC-AC inverters, in a distributed architecture; i.e., one power module per PV module. In such systems, each power module may be mounted to the face (i.e., backsheet surface or superstrate) of the corresponding PV module.

Over the life of the PV module, the PV module experiences mechanical stress due to a variety of conditions, such as weather and temperature, transporting the PV module, or even a person (such as a PV system maintenance worker) walking on installed modules. The mechanical and thermal loads applied to the PV module will flex or bow (out of plane) or elongate or shrink (in plane) the PV module relative to the mounted components, causing the potential for significant out-of-plane and in-plane loads to develop due to attached components such as a power converter. Such extraneous loads cause stress at the bonds between the PV module and the power module, and may damage one or both of the PV module and the attached components such as a mounted power module and related attachment components (e.g., the mounting hardware and related adhesively mounted interface). For example, such extraneous loads may result in excessive stress on a power module electrical connector coupled to the PV module, causing the electrical connector to crack.

Therefore, there is a need in the art for an apparatus for effectively (for both mechanical and thermal effects) mounting a power converter to a PV module.

SUMMARY OF THE INVENTION

Embodiments of the present invention generally relate to an apparatus for mounting a power module. In one embodiment, the apparatus comprises a plurality of mounting points that (i) are flexibly connected to one another and (ii) flexibly mount the power module proximate a photovoltaic (PV) module.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
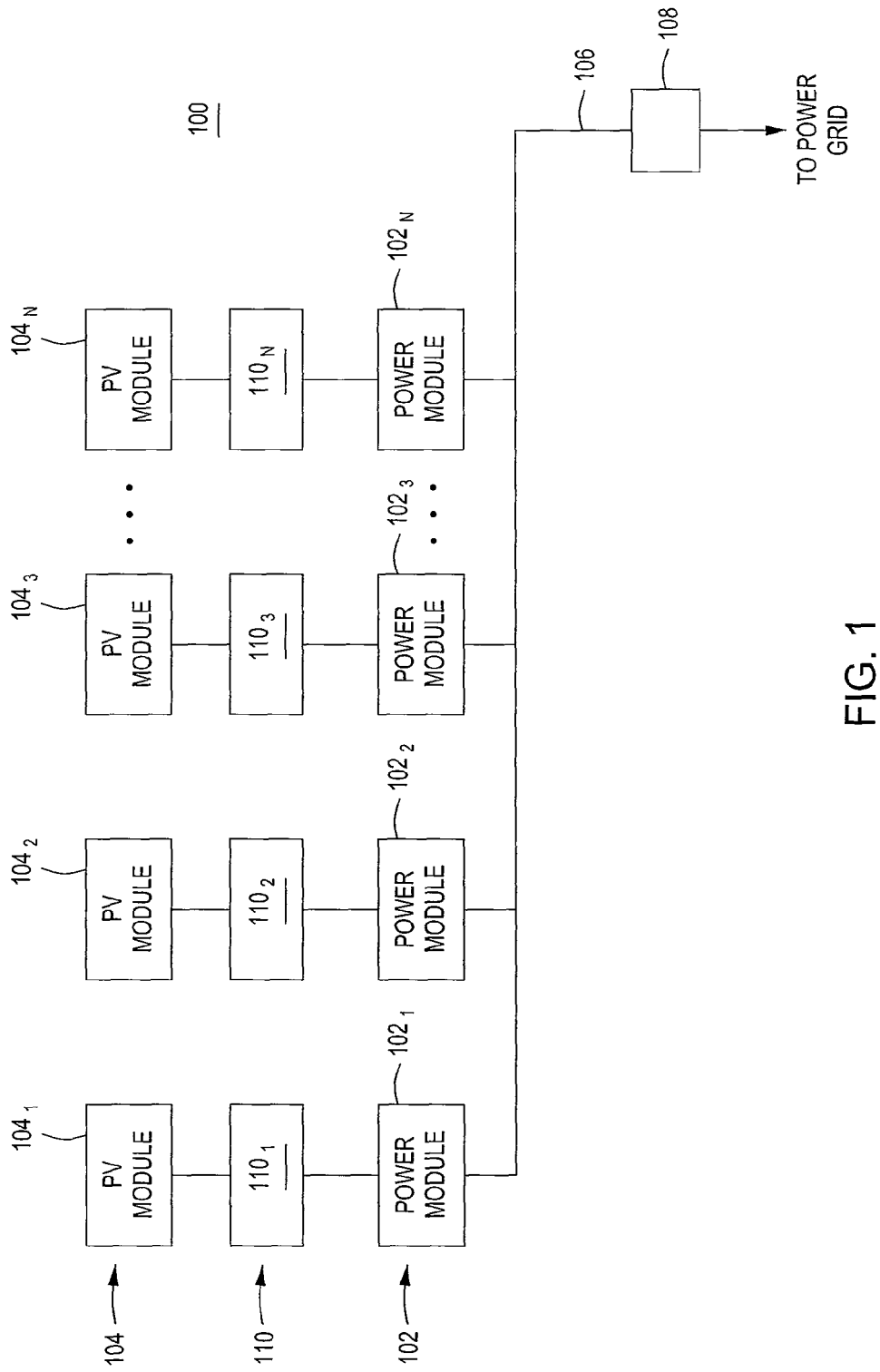
FIG. 1 is a block diagram of a photovoltaic (PV) system for generating power in accordance with one or more embodiments of the present invention.

FIG. 1 is a block diagram of a photovoltaic (PV) system 100 for generating power in accordance with one or more embodiments of the present invention. This diagram only portrays one variation of the myriad of possible system configurations. The present invention can function in a variety of environments and systems.

The PV system 100 comprises a plurality of power modules $102_1, 102_2 \ldots 102_n$ (collectively power modules 102), a plurality of PV modules $104_1, 104_2 \ldots 104_n$ (collectively PV modules 104), and a plurality of resilient mounting assemblies $110_1, 110_2 \ldots 110_n$ (collectively resilient mounting assemblies 110). In some embodiments, such as the embodiment depicted in FIG. 1, the power modules 102 are DC-AC inverters for inverting DC power generated by the PV modules 104 to AC power (i.e., AC current). In such embodiments, the power modules 102 are coupled to a bus 106 (i.e., an AC bus), which in turn is coupled to a load center 108, for distributing the AC output power produced by the power modules 102. The load center 108 may house connections between an AC commercial power grid distribution system and the AC bus 106, and the power modules 102 meter out AC current that is in-phase with the AC commercial power grid voltage and coupled to the commercial power grid via the load center 108; in some embodiments, the power modules 102 may additionally or alternatively generate reactive power. In other embodiments, the power modules 102 may be DC-DC converters and the bus 106 may carry DC energy to a DC-AC inverter at the junction box 108. In still other embodiments, the power modules 102 may be DC junction boxes and may be coupled to a DC-DC converter or DC-AC inverter. The generated AC or DC power may additionally or alternatively be supplied directly to commercial and/or residential systems via the load center 108, as well as stored for later use (for example, the generated energy may be stored utilizing batteries, heated water, hydro pumping, $H_2O$-to-hydrogen conversion, or the like).

In accordance with one or more embodiments of the present invention, each power module $102_1$, $102_2$ ... $102_n$ is individually coupled to a PV module $104_1$, $104_2$ ... $104_n$, respectively, via a resilient mounting assembly $110_1$, $110_2$ ... $110_n$, respectively, in a one-to-one correspondence such that any interface loads (for example due to relative differentials in curvature and coefficient of thermal expansion based linear expansions in a PV module 104 between the PV module 104 and the mounted component) are limited or eliminated. The resilient mounting assemblies 110 are pseudo-kinematic mounts that mechanically mount the power modules 102 to the PV modules 104 without generating a significant out-of-plane load during a range of bowing or flexing of the PV modules 104, as further described below. As described in detail below, the resilient mounting assembly 110 comprises at least one pad, coupled to the corresponding PV module 104, for flexibly retaining a power module mounting component (e.g., one or more protuberances extending from the power module 102) such that a gap exists between the power module interface surface and the PV module 104, where maximum bonded pad size is limited in size to mitigate in place coefficient of thermal expansion in place shear loads at the bond as well as to minimize heat retention effects. The power module interface surface may be whatever power module feature is in closest proximity to the back of the PV module 104, and could be a face, surface, or mounting feature. In addition, where multiple mounting locations are indicated by the load levels of the mounted unit, those multiple mounting locations may be flexibly connected to each other such that additional large in-place coefficient of thermal expansion relative strain induced loads do not manifest. The combination of the mounting characteristics of the power module 102 combined with the design features of the resilient mounting assembly 110 produce a design resistant to developing extraneous loads due to thermal or mechanical module distortions.

Figure 2:
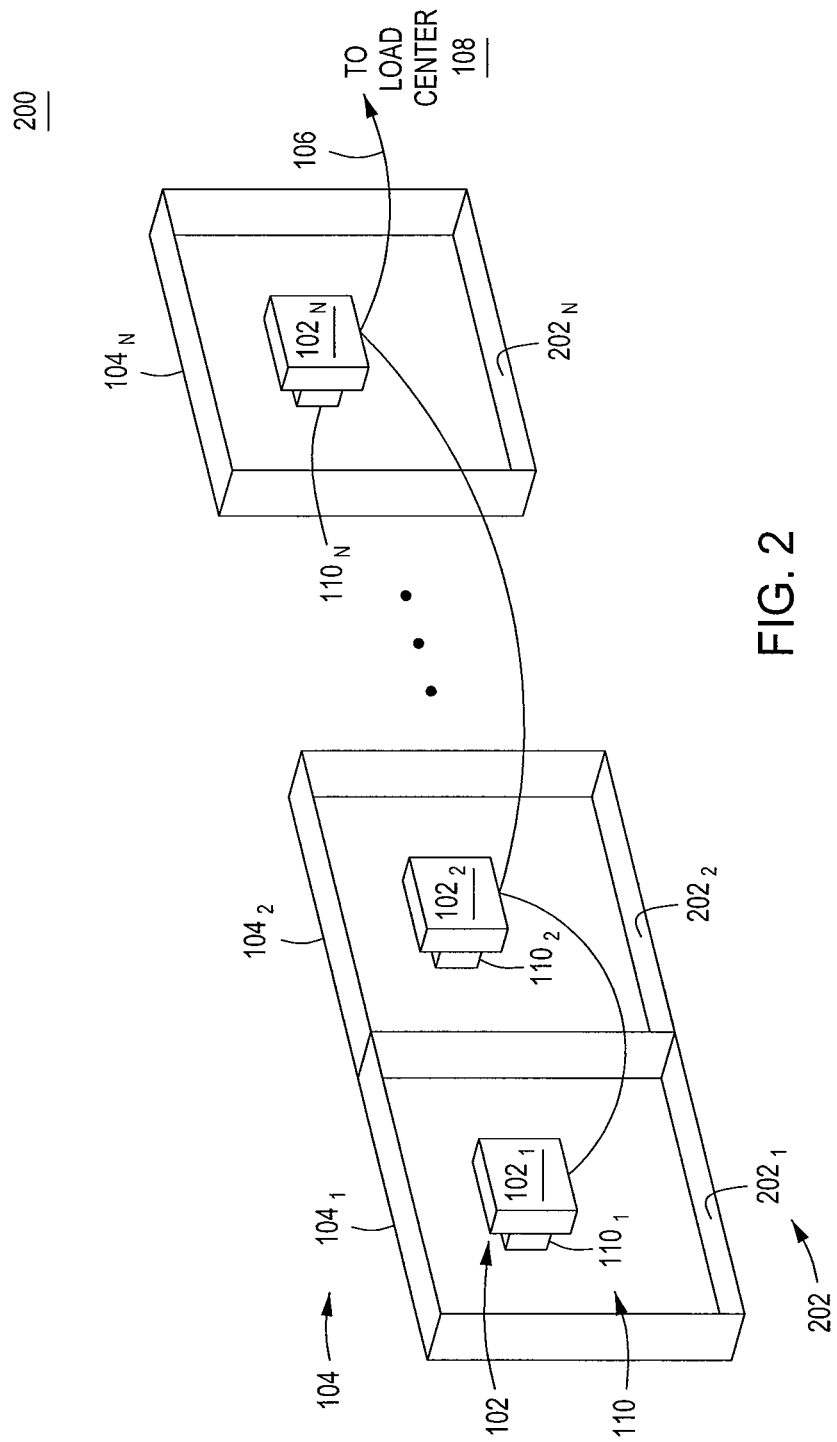
FIG. 2 is a block diagram depicting a physical layout of the PV system in accordance with one or more embodiments of the present invention

FIG. 2 is a block diagram depicting a physical layout of the PV system 100 in accordance with one or more embodiments of the present invention. Each PV module $104_1$, $104_2$ ... $104_n$ comprises a structural frame $202_1$, $202_2$ ... $202_n$, respectively, collectively referred to as frames 202. Each of the frames 202 surrounds the perimeter of the corresponding PV module 104 and may be constructed of any rigid material, such as aluminum, rigid plastic, and the like, or any combination of such rigid materials. The frames 202 of the PV modules 104 are generally coupled flush with the frames 202 of neighboring PV modules 104 in a horizontal direction.

The power modules $102_1$, $102_2$ ... $102_n$ are coupled to the resilient mounting assemblies $110_1$, $110_2$ ... $110_n$, respectively, in a one-to-one correspondence, and the resilient mounting assemblies $110_1$, $110_2$ ... $110_n$ are further coupled to the PV modules $104_1$, $104_2$ ... $104_n$, also in a one-to-one correspondence. The resilient mounting assemblies 110 flexibly mount the power modules 102 proximate (i.e., spaced apart from) the rear face of the PV modules 104 (i.e., the side of the PV module that faces away from the sun) such that each of the power modules 102 "floats" on the corresponding PV module face to accommodate a range of flexure for the PV module 104 without generating a significant out-of-plane load.

In addition to being mechanically mounted to the PV modules 104, the power modules 102 are electrically coupled to the DC outputs of the PV modules 104 via the resilient mounting assemblies 110. The power at the output of the power modules 102 is coupled to the bus 106 which in turn is coupled to the load center 108.

Figure 3:
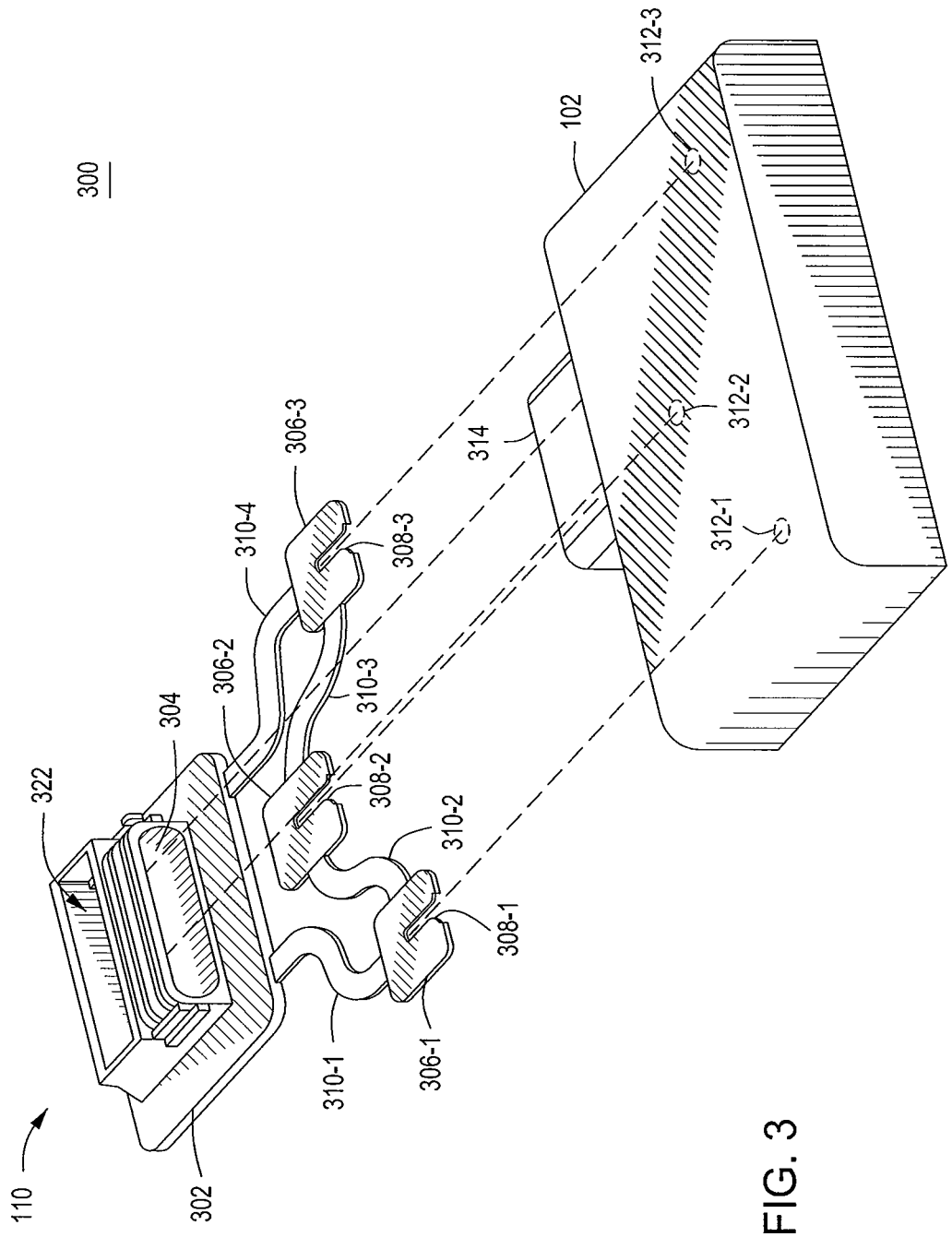
FIG. 3 depicts a perspective view of a resilient mounting assembly and a power module in accordance with one or more embodiments of the present invention.

FIG. 3 depicts a perspective view of a resilient mounting assembly 110 and a power module 102 in accordance with one or more embodiments of the present invention.

The resilient mounting assembly 110 is formed of a resilient flexible material, such as a compliant plastic, having sufficient resistance to environmental impacts such as UV rays, oxidation, salt spray, and the like, as well as sufficient resistance to exposures such as industrial and roof-top chemicals and the like. The resilient mounting assembly 110 comprises a generally rectangular base 302, for example on the order of 210 mm×210 mm, although in other embodiments the base 302 may be of a difference size and/or shape, formed from rigid polyphenylene oxide (PPO) thermoplastic. A flange 320 extends perpendicular to the base and defines a shallow, open well 322 through which conductive DC contacts of the PV module 104 may be accessed. The well 322 allows the PV module DC contacts to be accessed after the base 302 has been adhered to the PV module 104. The PV module DC contacts may then be coupled, for example, to a DC connection assembly for providing DC current from the PV module 104 through a connector 304 of the resilient mounting assembly 110 to a power module 102. The well 322 may subsequently be sealed by a cover and/or encapsulated with a non-conductive potting material having limited moisture absorption properties, such as silicone, polyurethane, or the like, for protecting the electrical connections between the PV model 104 and the connector 304 from environmental factors and foreign matter. The potting material may have suitable properties such the ability to provide adhesion to the PV module 104 and the base 302 to maintain a seal; low stiffness to not develop loads; resistance to exposures such as UV rays, rooftop chemicals, salt spray, and the like; resistance to oxidation embrittlement; and the ability to meet process controls such as cure time based on production needs and reasonably achievable curing methods.

The resilient mounting assembly 110 further comprises a plurality of pads 306-1, 306-2, and 306-3 (collectively referred to as pads 306), which are connected to one another and to the base 302 by a plurality of webs 310. In some embodiments, the pads 306 are formed of rigid polyphenylene oxide (PPO) thermoplastic, with stiffening ribs, to fully develop the bond stress across the entire bond area, and may have dimensions on the order of 1.5 in×2 in/38.1 mm×50.8 mm. The pads 306 and webs 310 are coplanar with the base 302, and the pads 306 are adhered to the PV module 104 as described further below with respect to FIG. 4. A web 310-1 extends from the base 302 to the pad 306-1; a web 310-2 extends from the pad 306-1 to the pad 306-2; a web 310-3 extends from the pad 306-2 to the pad 306-3; and a web 310-4 extends from the pad 306-3 to the base 302. The webs 310 may be substantially S-shaped, for example as depicted in FIG. 3; alternatively, the webs 310 may be any other suitable shape for interconnecting the pads 306 and the base 302. The primary design criteria for the webs 310 are that they be sufficiently stiff to support self-jigging (i.e., the webs 310 allow the multiple mount components—the base 302 and the pads 306—to be self-jigged) and maintain dimensional alignment of each pad 306 for in-plane position and rotation for all reasonable handling and application loads, and sufficiently soft to not generate extraneous coefficient of thermal expansion loads due to differential expansions between the mounted component and PV module 104. When mounting large and/or heavy components to a PV module 104, large and/or multiple bond areas may be required to minimize delamination stresses; by using multiple pads 306 that are not rigidly connected, loads (for example due to curvature or coefficient of thermal expansion mismatched growth as compared to the bond pad) are not developed between pads/contacts. The webs 310 may have a height such that there is a clearance between the webs 310 and the power module face when the PV module 104 is unflexed; alternatively, the webs 310 may contact either the back of the power module 102, or the PV module 104, but sufficient gap is maintained at one or both locations to ensure that, at maximum thermal or mechanical deflection, minimal or no out-of-plane loads are developed at the interface.

In some embodiments, the pads 306 may be arranged in a "V" shape; for example, pads 306-1 and 306-3 may be horizontally collinear and the pad 306-2 is positioned between the pads 306-1/306-3 but offset to be closer to the base 302. In other embodiments, the pads 306 may be disposed in other physical arrangements, such as a collinear arrangement. The base 302 and pads 306 may be spaced apart to minimize curvature and relative expansion related forces which increase with footprint of a component mounted to a PV module 104; in some embodiments, the resilient mounting assembly 110 may have an overall footprint to support a power module 102 having an approximate 17×17 cm size. In some embodiments, the height of the stack-up does not exceed 22 mm; in other embodiments, the height of the stack-up may be as high as 31.4 mm.

In some alternative embodiments, the resilient mounting assembly 110 may comprise two pads 306 or even a single pad 306. Additionally or alternatively, the webs 310 may not be used to interconnect the pads 306 and the base 302 (i.e., the resilient mounting assembly 110 comprises two or more independent supports). For example, the base 302 and the pads 306 may be physically separate (i.e., independent) components. In such embodiments, the base 302 and the one or more pads 306 must be bonded to the PV module 104 in their proper locations, and therefore the base 302/pad(s) 306 must be appropriately aligned by a suitable means when being mounted to the PV module 104. For example, a carrier (or "placement jig") may be provided (e.g., by the PV module manufacturer) which holds each of the base 302/pad(s) 306 in their proper position until the bonding becomes permanent (i.e., until the permanent adhesive has set). The carrier may then be removed and reused for mounting another resilient mounting assembly 110 on another PV module 104. Additionally, in some such embodiments, if only cables are to be coupled to the PV module 104 (i.e., no power module 102 is to be mounted to the PV module 104), the pads 306 are not required and may be omitted at manufacturing.

The power module 102 comprises a plug 314 projecting from one end of the power module 102 for physically coupling to the connector 304 and thereby electrically coupling the power module 102 to the PV module DC output. The coupled plug 314/connector 304 provides a rigid mounting point for the power module 102. The design of the mounted hardware, at the system level, will be such that limited to no O-ring/seal translation will occur due to thermal or mechanical cyclic/variant loads.

The power module 102 further comprises a plurality of protuberances, or "feet", 312-1, 312-2, and 312-3 (collectively referred to as feet 312). The feet 312 extend perpendicular from the bottom of the power module 102 (i.e., facing the PV module 104). The feet 312 may be part of the form factor of the power module 102 and may be a rigid material such as metal or hard plastic; alternatively, the feet 312 may be adhered to the power module 102 by a suitable adherent.

Each of the resilient mounting assembly pads 306-1, 306-2, and 306-3 defines a groove 308-1, 308-2, and 308-3, respectively, suitably sized and shaped such that the power module feet 312-1, 312-2, and 312-3 may engage the corresponding groove 308 and slide into the groove 308 while maintaining a gap between each pad 306 and the corresponding foot 312 to flexibly retain the feet 312. The thickness of the pads 306 and the height of the feet 312 are such that, when the PV module 104 is not flexed or bowed, a clearance, or gap, exists between the bottom of each foot 312 and the PV module 104 as described below with respect to FIG. 5. The pads 306 thus provide flexible (i.e., non-rigid) mounting points for the power module 102. By retaining the power module 102 in such a manner, the resilient mounting assembly 110 mechanically couples the power module 102 to the PV module 104 while allowing it to "float" above the PV module 104 to accommodate a range of bowing and flexing of the PV module 104 (i.e., while the PV module 104 flexes over a range, the power module 102 remains rigid and not subject to the stress from the PV module flexure).

Figure 4:
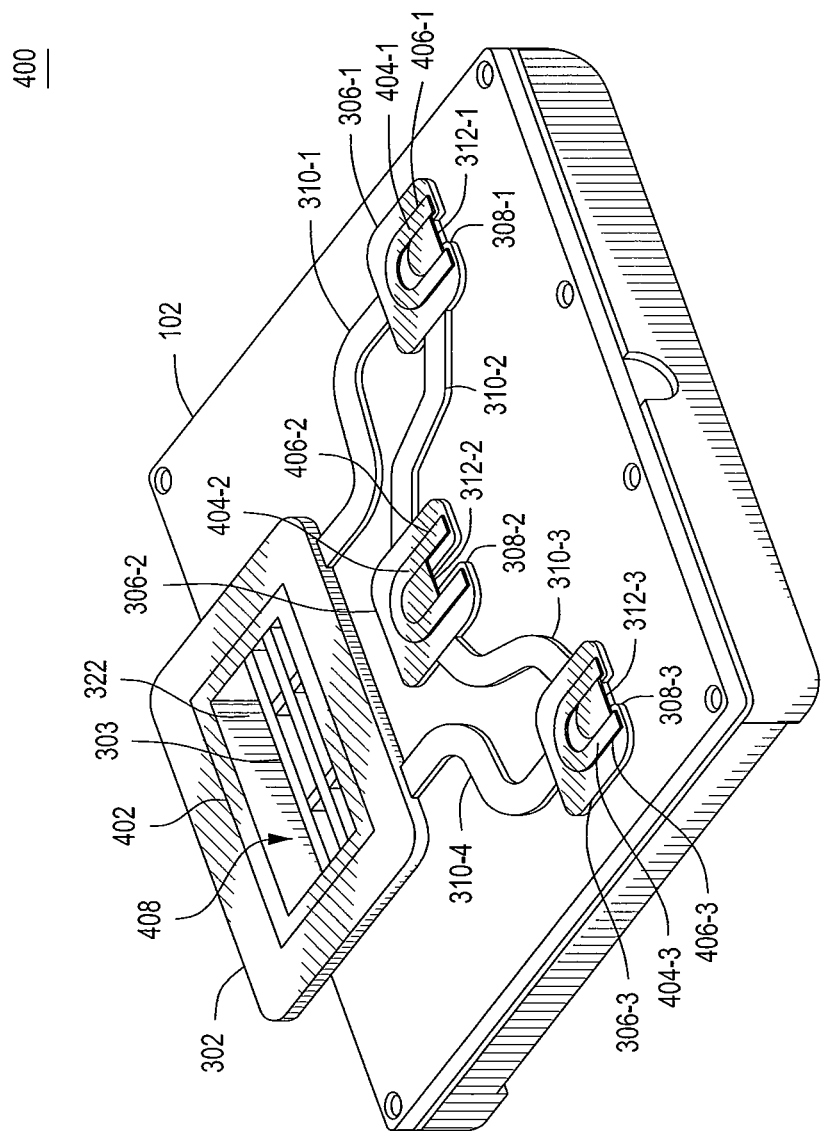
FIG. 4 depicts an underside view of a power module coupled to a resilient mounting assembly in accordance with one or more embodiments of the present invention.

FIG. 4 depicts an underside view of a power module 102 coupled to a resilient mounting assembly 110 in accordance with one or more embodiments of the present invention. The power module feet 312-1, 312-2, and 312-3 extend through the grooves 308-1, 308-2, and 308-3, respectively, of the pads 306-1, 306-2, and 306-3, respectively. The bottom of each pad 306-1, 306-2, and 306-3 defines an adhesive well 406-1, 406-2, and 406-3 (collectively referred to as adhesive wells 406), respectively, and the bottom of the base 302 defines an adhesive well 408. The adhesive wells 406 and 408 are potted with an adhesive material, such as a silicone adhesive, for adhering the resilient mounting assembly 110 to the PV module 104. Generally, the adhesive material has properties such as the ability to provide adhesion to the PV module 104 and the base 302 to maintain a seal; low stiffness so as not to develop loads; resistance to exposures such as temperature fluctuations, UV rays, rooftop chemicals, salt spray, and the like; resistance to oxidation embrittlement; suitable modulus (e.g., avoid glass transition temp at cold, provide compliance to differential thermal expansion); and the ability to meet process controls such as cure time based on production needs and reasonably achievable curing methods. The adhesive wells 406 and 408 may each have a depth (e.g., on the order of 1.0 mm) to maintain a minimum thickness for the adhesive in order to minimize peak shear strain in adhesive due to differential expansion between the PV module 104 and the mounted configuration.

An immediate adhesive, such as a double-sided resilient foam tape, may be applied as pad adhesives 404-1, 404-2, and 404-3 (collectively referred to as pad adhesives 404) along the perimeter of each groove 308-1, 308-2, and 308-3, respectively (e.g., in a "U" shape around the groove 308) and as a base adhesive 402 around the perimeter of the well 322 (e.g., in a rectangular shape surrounding the well 322). The pad adhesives 404 and the base adhesive 402 provide immediate secure adhesion for attaching the resilient mounting assembly 110 to the PV module 104, thereby allowing the integrated PV module 104/resilient mounting assembly 110 to be moved immediately following assembly without any wait time while the adhesive within the adhesive wells 406 and 408 is curing. Additionally, the pad adhesives 404 and the base adhesive 402 act as dams for the adhesive material potted within the adhesive wells 406 and 408 (i.e., to prevent the adhesive material from entering the grooves 308 or the well 322, respectively). In some alternative embodiments, a different quick-curing adhesive may be used for the pad adhesive 404 and/or the base adhesive 402.

Figure 5:
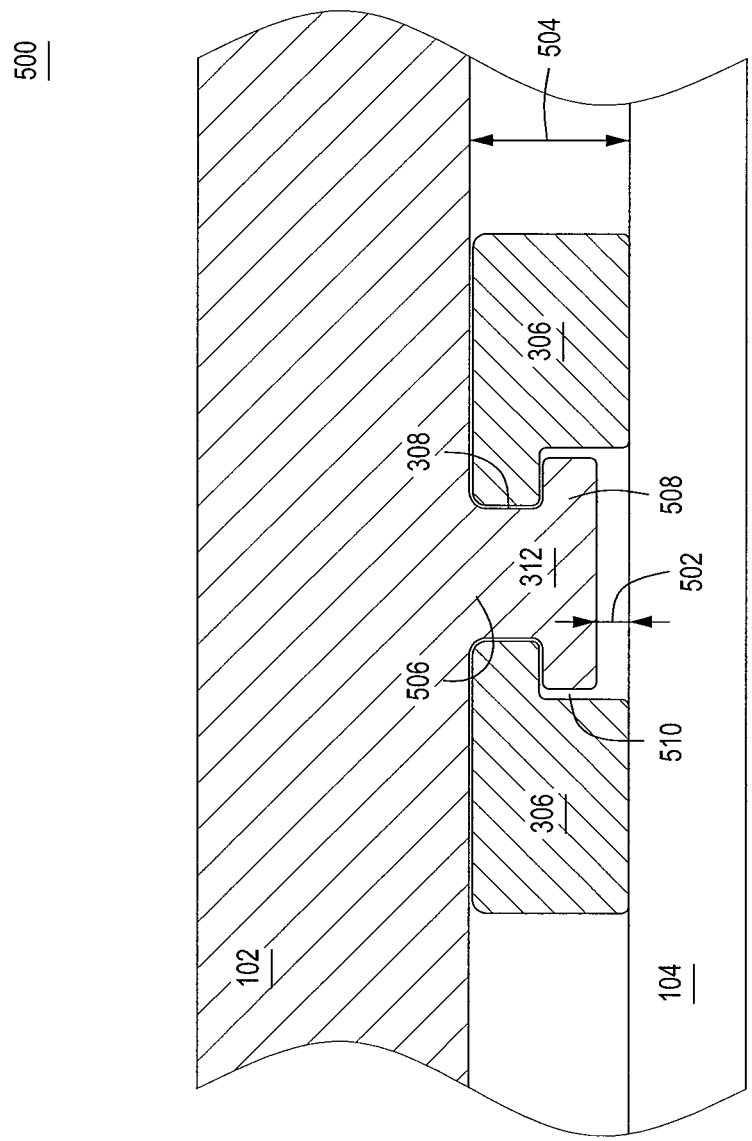
FIG. 5 depicts a close-up, perspective view of a power module foot retained by a resilient mounting assembly pad in accordance with one or more embodiments of the present invention.

FIG. 5 depicts a close-up, perspective view of a power module foot 312 retained by a resilient mounting assembly pad 306 in accordance with one or more embodiments of the present invention. The pad 306 defines the groove 308 such that the width of the groove 308 at the top of the pad 306 (i.e., the side of the pad 306 facing the power module 102) is more narrow than the width of the groove 308 at the bottom of the pad 306 (i.e., the side of the pad 306 adhered to the PV module 104). The foot 312 is formed of a shaft 506 with a nodule 508 at the end of the shaft 506. The shaft 506 is sized such that the shaft 506 fits within the smallest width of the groove 308, and the nodule 508 is sized such that it fits within the widest portion of the groove 308 and cannot pass through the smallest width of the groove 308, thereby retaining the foot 312 once inserted into the groove 308. When inserting the foot 312 into the groove 308, the foot 312 is aligned with the groove 308 such that that nodule 508 is aligned with the widest area of the groove 308 (near the PV module face). The foot 312 may then be slid into the groove 308. A gap, such as gap 510, is present between the foot 312 and the pad 306, and the foot is flexibly retained by the pad 306.

When the PV module 104 is unflexed, a first gap 502 is present between the bottom of the foot 312 and the PV module 104. The first gap 502 allows the power module 102 to be retained by the resilient mounting assembly 110 but still accommodate a range of flexing or bowing of the PV module 104 without creating a significant out of plane load; in some alternative embodiments, a low stiffness mount at feet sufficient to maintain adequate minimum modal frequency as a minimum stiffness may be utilized. The pad 306 and the foot 312 are sized such that the first gap 502 has a width based on an expected amount of PV module flexure. Generally, the pad 306 and the foot 312 are sized to achieve the gap 502 such that, at maximum range of expected thermal and/or mechanically induced deflection of the PV module surface, there is no impingement of the back surface of the PV module 104 to contact or interfere with the near surface of the power module 102.

Additionally, the height of the pad 306 is sized to provide a second gap 504 between the power module 102 and the PV module 104 when the PV module 104 is unflexed. The second gap 504 allows air circulation between the power module 102 and the PV module 104 for maintaining a suitable thermal profile across the PV module cells as well as the power module 102. In some embodiments, the width of the gaps 502 and/or 504 are determined by analyzing standard PV modules 104 and satisfying criteria that at maximum range of expected thermal and/or mechanically induced deflection of the PV module surface, there is no (or very little) impingement of the back surface of the PV module 104 to contact or interfere with the near surface of the power module 102.

Figure 6:
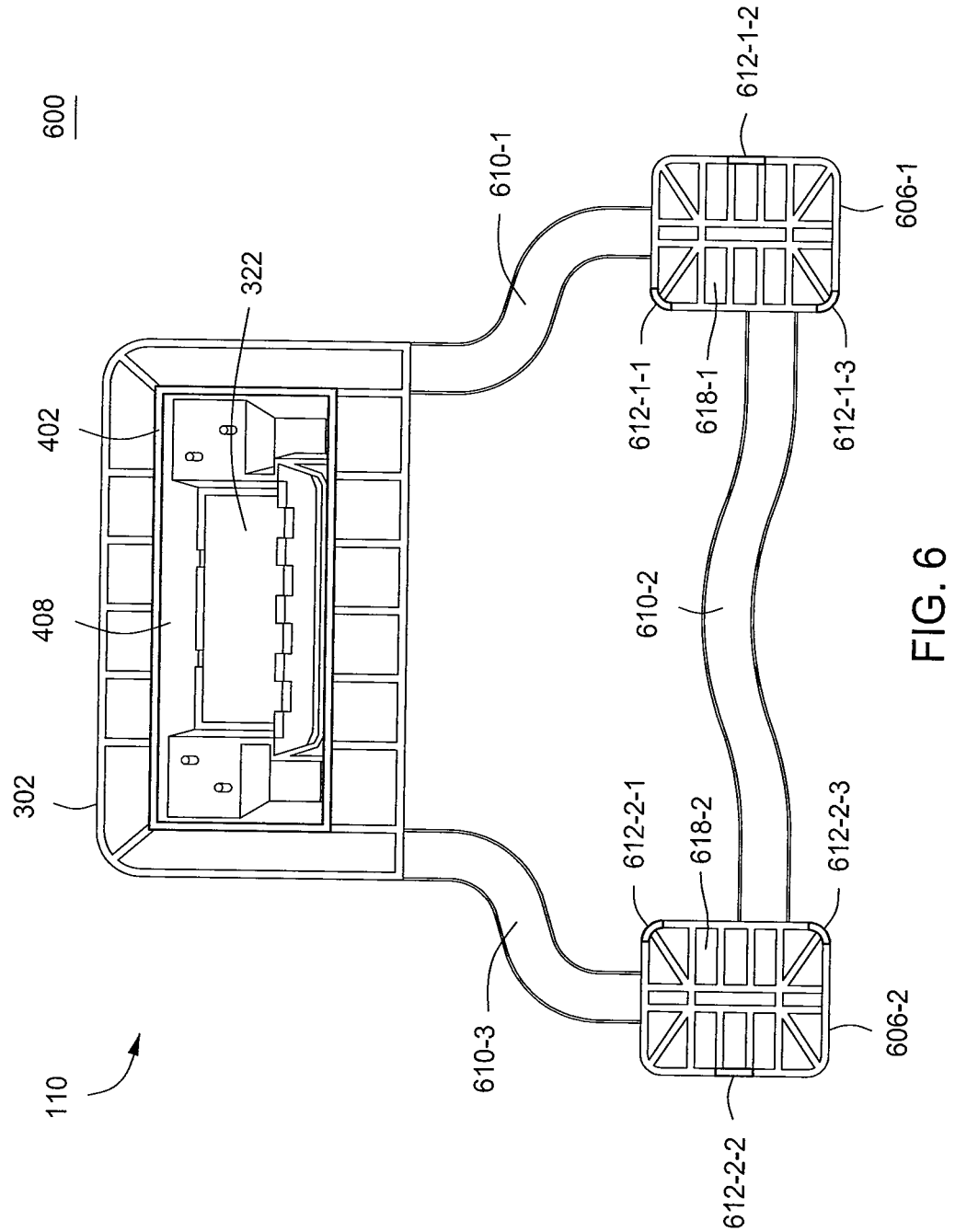
FIG. 6 is an underside perspective view of a resilient mounting assembly in accordance with one or more other embodiments of the present invention.

FIG. 6 is an underside perspective view of a resilient mounting assembly 110 in accordance with one or more other embodiments of the present invention. The resilient mounting assembly 110 is formed of a resilient flexible material, such as a compliant plastic, having sufficient resistance to environmental impacts such as UV rays, temperature fluctuations, oxidation effects, salt spray, and the like, as well as sufficient resistance to exposures such as industrial and roof-top chemicals and the like. The resilient mounting assembly 110 comprises the base 302 and a plurality of pads 606-1 and 606-2 (collectively referred to as pads 606), which are connected to one another and to the base 302 by a plurality of webs 610. In some embodiments, the pads 606 are formed of rigid polyphenylene oxide (PPO) thermoplastic, with stiffening ribs, to fully develop the bond stress across the entire bond area, and may have dimensions on the order of 1.5 in×2 in/38.1 mm×50.8 mm. The pads 606 and webs 610 are coplanar with the base 302, and the pads 606 are adhered to the PV module 104 as described further below with respect to FIGS. 6 and 7. Each of the pads 606 generally has a lattice structure that defines a plurality of open areas within the perimeter of the pad 606, for example open area 618-1 within pad 606-1 and open area 618-2 within pad 606-2, such that the pad 606 does not completely cover the portion of the PV module 104 on which it is adhered.

In some embodiments, the pads 606 and the base 302 may be arranged in a "V" shape; for example, the pads 606 may be horizontally collinear and the base 302 is positioned between the pads 606 but offset to form the bottom of the "V" shape. In other embodiments, the pads 606 may be disposed in other physical arrangements with respect to the base 302. The pads 606 are spaced apart from one another at a distance of approximately the power module width such that opposing sides of the power module 102 are supported as described below with respect to FIG. 8. In some embodiments, the resilient mounting assembly 110 as depicted in FIG. 6 may have a footprint up to 2.58 in×5 in/65.53 mm×127 mm. In some embodiments, the height of the stack-up does not exceed 22 mm; in other embodiments, the height of the stack-up may be as high as 31.4 mm.

A web 610-1 extends from the base 302 to the pad 606-1; a web 610-2 extends from the pad 606-1 to the pad 606-2; and a web 610-3 extends from the pad 606-2 to the base 302. The webs 610 allow the multiple mount components (i.e., the base 302 and the pads 606) to be self-jigged. The webs 610 may be any suitable shape for interconnecting the pads 606 and the base 302. The primary design criteria for the webs 610 are that they be sufficiently stiff to support self-jigging and maintain dimensional alignment of each pad 606 for in-plane position and rotation for all reasonable handling and application loads, and sufficiently soft so as not to generate extraneous coefficient of thermal expansion loads due to differential expansions between the mounted component and PV module 104. When mounting large and/or heavy components to a PV module 104, large and/or multiple bond areas may be required to minimize delamination stresses; by using multiple pads 606 that are not rigidly connected, loads (for example due to curvature or coefficient of thermal expansion mismatched growth as compared to the bond pad) are not developed between pads/contacts. The webs 610 have a height such that there is a clearance between the webs 610 and the power module face when the PV module 104 is unflexed; alternatively, the webs 610 may contact either the back of the power module 102 or the PV module 104, but sufficient gap is maintained at one or both locations to ensure that, at maximum thermal or mechanical deflection, minimal or no out-of-plane loads are developed at the interface.

In some alternative embodiments, the webs 610 may not be used to interconnect the pads 606 and the base 302; i.e., the base 302 and the pads 606 may be physically separate (i.e., independent) components. In such embodiments, the base 302 and the pads 606 must be bonded to the PV module 104 in their proper locations, and the base 302/pads 606 must be appropriately aligned by a suitable means when being mounted to the PV module 104. For example, a carrier may be provided (e.g., by the PV module manufacturer) which holds each of the base 302 and the pads 606 in their proper position until the bonding becomes permanent (i.e., until the permanent adhesive has set). The carrier may then be removed and reused for mounting the resilient mounting assembly 110 on another PV module 104. Additionally, in some such embodiments, if only cables are to be coupled to the PV module 104 (i.e., no power module 102 is to be mounted to the PV module 104), the pads 606 are not required and may be omitted at manufacturing.

The bottom of each pad 606 defines a plurality of adhesive wells 612 to be filled with an adhesive for adhering the pads 606 to the PV module 104. In some embodiments, such as the embodiment described herein, each pad 606 may define three adhesive wells 612 located along the outer boundary of the pad 606 (e.g., spaced roughly equally apart from one another); in other embodiments, fewer or more adhesive wells 612 may be utilized. The bottom of pad 606-1 defines adhesive wells 612-1-1, 612-1-2, and 612-1-3; the bottom of the pad 606-2 defines adhesive wells 612-2-1, 612-2-2, and 612-2-3; and the bottom of the pad 606-3 defines adhesive wells 612-3-1, 612-3-2, and 612-3-3. Two of the adhesive wells 612 are located at adjacent corners of the pad perimeter with the third adhesive well 612 at the center of the opposing side of the pad 606 (i.e., forming an isosceles triangle coplanar with respect to the bottom of the pad 606). In other embodiments, the adhesive wells 612 may be arranged differently for the pad 606. The adhesive wells 612 are potted with an adhesive material, such as a silicone adhesive, for adhering the pad 606 to the PV module 104. Generally the adhesive material has properties such the ability to provide adhesion to the PV module 104 and the base 302 to maintain a seal; low stiffness so as not to develop loads; resistance to exposures such as temperature fluctuations, UV rays, rooftop chemicals, salt spray, and the like; resistance to oxidation embrittlement; suitable modulus (e.g., avoid glass transition temp at cold, provide compliance to differential thermal expansion); and the ability to meet process controls such as cure time based on production needs and reasonably achievable curing methods. The adhesive wells 612 may have a depth (e.g., on the order of 1.0 mm) to maintain a minimum thickness for the adhesive in order to minimize peak shear strain in adhesive due to differential expansion between the PV module 104 and the mounted configuration. An immediate adhesive, such as a double-sided resilient foam tape, may be applied as the base adhesive 402, for example around the shallow well 322 (e.g., in a rectangular shape surrounding the opening of the shallow well 622). Additionally, the immediate adhesive may be applied to the bottom of each pad 606 to provide immediate secure adhesion for attaching the resilient mounting assembly 110 to the PV module 104. The integrated PV module 104/ resilient mounting assembly 110 may then be moved immediately following assembly without any wait time while the adhesive within the adhesive wells 612 and the adhesive well 408 of the base 302 are curing. In some alternative embodiments, a different quick-curing adhesive may be used for the base adhesive 402 as well as for the pads 606.

By using a three-point design for the resilient mounting assembly 110, as depicted in FIG. 6, and minimally constraining each attach point, minimum attach loads are generated.

Figure 7:
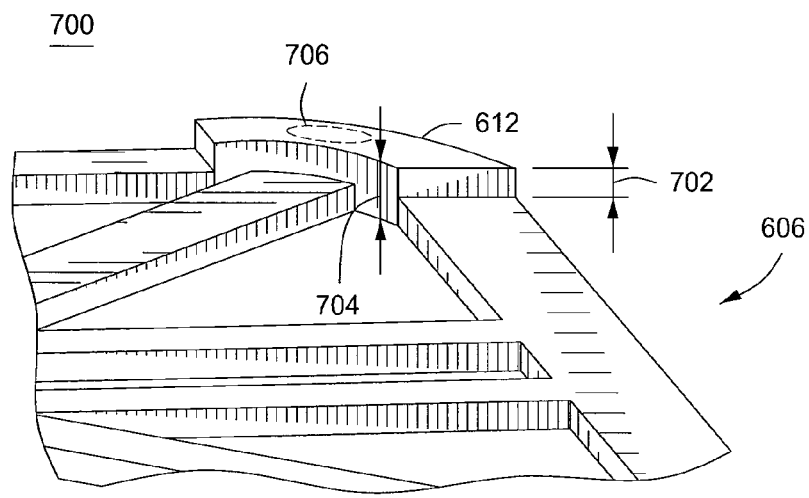
FIG. 7 is a close-up perspective view of an adhesive well in accordance with one or more other embodiments of the present invention.

FIG. 7 is a close-up perspective view of an adhesive well 612 in accordance with one or more other embodiments of the present invention. The adhesive well 612 has a step height 702 rising above the remaining portion of the base 606. The adhesive well 612 is hollow on its underside and is potted with an adhesive material, such as a silicone adhesive, for adhering the pad 606 to the PV module 104. The step height 702 provides a controlled adhesive thickness (i.e., the adhesive thickness is determined by the step height 702) such that each pad 606 may have a suitable bond height when mounted to the PV module 104. In some embodiments, the adhesive well 612 may have a total height 704 on the order of 1.0 mm, at a minimum, with a suitable step height 702 to maintain a minimum adhesive thickness for adhering the resilient mounting assembly 110 to the PV module 104; maintaining a minimum adhesive thickness decreases peak shear strain in adhesive due to differential expansion between the PV module 104 and the mounted configuration.

In some embodiments, the wall of the adhesive well 612 may define an aperture 706, for example on the top wall of the adhesive well 612, to allow any excessive adhesive to escape, thereby allowing the pad 606 to be flushly mounted to the PV module 104.

Figure 8:
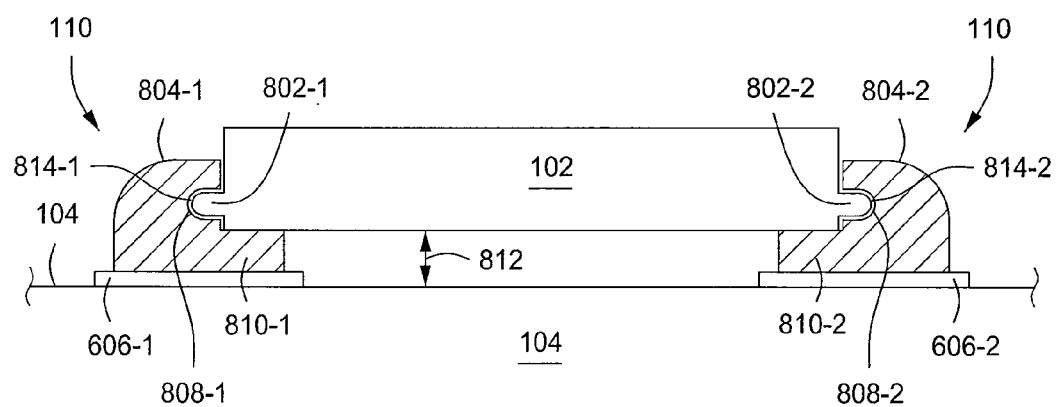
FIG. 8 is a side perspective view of a power module coupled to a resilient mounting assembly in accordance with one or more other embodiments of the present invention.

FIG. 8 is a side perspective view of a power module 102 coupled to PV module 104 by a resilient mounting assembly 110 in accordance with one or more other embodiments of the present invention. The pads 606 are mounted to the face of the PV module 104 as described above. A retention arm 804-1 is mounted atop the pad 606-1, and a retention arm 804-2 is mounted atop the pad 606-2. The retention arms 804-1 and 804-2, collectively referred to as retention arms 804, are formed of any rigid material, such as metal or hard plastic; in some embodiments the pads 606 and the corresponding retention arm 804 may be part of the same form factor.

The retention arms 804-1 and 804-2 define grooves 808-1 and 808-2, respectively. The grooves 808-1 and 808-2 (collectively referred to as grooves 808) are sized and shaped to retain protuberances 802-1 and 802-2 (collectively referred to as protuberances 802), respectively, which extend from opposite sides of the power module 102. The protuberances 802 may be part of the form factor of the power module 102 or, alternatively, the protuberances 802 may be adhered to the power module 102 by a suitable adherent.

When mounting the power module 102 to the resilient mounting assembly 110, the power module 102 may be aligned along the same plane with the resilient mounting assembly 110 and horizontally slid between the retention arms 804 such that the plug 314 is physically coupled to the connector 304, as previously described with respect to FIG. 3, and the protuberances 802 are received by the grooves 808 with a small gap 814 maintained between the protuberances 802 and the grooves 808. The coupled plug 314/connector 304 provides a rigid mounting point for the power module 102 while the protuberances 802 are flexibly retained by the grooves 808 (i.e., the pads 606/retention arms 804 provide flexible, or non-rigid, mounting points for the power module 102), allowing the power module 102 to "float" above the PV module 104 to accommodate a range of bowing and flexing of the PV module 104 (i.e., while the PV module 104 flexes over a range, the power module 102 remains rigid and not subject to the stress from the PV module flexure).

Additionally, a gap 812 is present between the power module 102 and the PV module 104 when the PV module 104 is unflexed. The gap 812 allows air circulation between the power module 102 and the PV module 104 for maintaining a suitable thermal profile across the PV module cells as well as the power module 102. The gap 812 also ensures little-to-no load on attach points and the bottom of the mounted power module 102.

The foregoing description of embodiments of the invention comprises a number of elements, devices, circuits and/or assemblies that perform various functions as described. For example, the base and pads described above are an example of a means for mechanically mounting a power module proximate the PV module; the base is an example a means for providing a rigid mounting point for the power module; the pads are examples of means for providing non-rigid mounting points for the power module. These elements, devices, circuits, and/or assemblies are exemplary implementations of means for performing their respectively described functions.

While the foregoing is directed to embodiments of the present invention, other and further embodiments of the invention may be devised without departing from the basic scope thereof, and the scope thereof is determined by the claims that follow.

The invention claimed is:

1. An apparatus for mounting a power module, comprising: a plurality of mounting points that (i) are flexibly connected to one another and (ii) flexibly mount the power module proximate a photovoltaic (PV) module, wherein at least one mounting point of the plurality of mounting points is dimensioned and arranged to resiliently float with respect to the PV module and at least one other of the plurality of mounting points in response to applied thermal or mechanical deflection forces.

2. The apparatus of claim 1, wherein the plurality of mounting points comprises a first mounting point and at least a second mounting point, wherein the first mounting point provides a rigid mounting point for the power module, and wherein each mounting point of the at least a second mounting point provides a non-rigid mounting point for the power module.

3. The apparatus of claim 2, wherein each mounting point of the at least a second mounting point defines a groove that retains a protuberance from the power module such that a first gap exists between the mounting point and the protuberance.

4. The apparatus of claim 3, wherein the protuberance is a power module foot, and wherein the foot is retained such that a second gap exists between the power module foot and the PV module when the PV module is unflexed.

5. The apparatus of claim 2, wherein the first mounting point electrically couples the power module to the PV module.

6. The apparatus of claim 2, wherein the at least a second mounting point comprises a second mounting point and a third mounting point; and wherein the first mounting point is coupled to the second mounting point by a first flexible web, the second mounting point is coupled to the third mounting point by a second flexible web, and the third mounting point is coupled to the first mounting point by a third flexible web.

7. The apparatus of claim 6, wherein the second and third mounting points each comprise a pad having a lattice structure and a plurality of adhesive wells for adhering the pad to the PV module.

8. The apparatus of claim 7, wherein for each adhesive well of the plurality of adhesive wells, a wall of the adhesive well defines an aperture for allowing excessive adhesive to escape.

9. The apparatus of claim 1, wherein the plurality of mounting points mount the power module proximate the PV module such that a space exists between a face of the power module and a face of the PV module.

10. The apparatus of claim 1, wherein the power module is a DC-AC converter.

11. A system for mounting a power module, comprising: the power module; a photovoltaic (PV) module; and a resilient mounting assembly comprising a plurality of mounting points that (i) are flexibly connected to one another and (ii) flexibly mount the power module proximate the PV module, wherein at least one mounting point of the plurality of mounting points is dimensioned and arranged to resiliently float with respect to the PV module and at least one other of the plurality of mounting points in response to thermal or mechanical deflection of the PV module.

12. The system of claim 11, wherein the plurality of mounting points comprises a first mounting point and at least a second mounting point, wherein the first mounting point provides a rigid mounting point for the power module, and wherein each mounting point of the at least a second mounting point provides a non-rigid mounting point for the power module.

13. The system of claim 12, wherein each mounting point of the at least a second mounting point defines a groove that retains a protuberance from the power module such that a first gap exists between the mounting point and the protuberance.

14. The system of claim 13, wherein the protuberance is a power module foot, and wherein the foot is retained such that a second gap exists between the power module foot and the PV module when the PV module is unflexed.

15. The system of claim 12, wherein the first mounting point electrically couples the power module to the PV module.

16. The system of claim 12, wherein the at least a second mounting point comprises a second mounting point and a third mounting point; and wherein the first mounting point is coupled to the second mounting point by a first flexible web, the second mounting point is coupled to the third mounting point by a second flexible web, and the third mounting point is coupled to the first mounting point by a third flexible web.

17. The system of claim 16, wherein the second and third mounting points each comprise a pad having a lattice structure and a plurality of adhesive wells for adhering the pad to the PV module.

18. The system of claim 17, wherein for each adhesive well of the plurality of adhesive wells, a wall of the adhesive well defines an aperture for allowing excessive adhesive to escape.

19. The system of claim 11, wherein the plurality of mounting points mount the power module proximate the PV module such that a space exists between a face of the power module and a face of the PV module.

20. The system of claim 11, wherein the power module is a DC-AC converter.

* * * * *